(12) United States Patent
Kwon

(10) Patent No.: US 7,905,006 B2
(45) Date of Patent: Mar. 15, 2011

(54) METHOD OF MANUFACTURING FACEPLATE FOR IN-THE-EAR HEARING AID

(76) Inventor: You Jung Kwon, Gwangju (KR)

( * ) Notice: Subject to any disclaimer, the term of this patent is extended or adjusted under 35 U.S.C. 154(b) by 219 days.

(21) Appl. No.: 12/376,150

(22) PCT Filed: Sep. 25, 2006

(86) PCT No.: PCT/KR2006/003795
§ 371 (c)(1),
(2), (4) Date: Feb. 3, 2009

(87) PCT Pub. No.: WO2008/023860
PCT Pub. Date: Feb. 28, 2008

(65) Prior Publication Data
US 2010/0088883 A1   Apr. 15, 2010

(30) Foreign Application Priority Data

Aug. 21, 2006 (KR) .................. 10-2006-0078664

(51) Int. Cl.
*H04R 31/00* (2006.01)
(52) U.S. Cl. ......... 29/594; 29/592.1; 29/609.1; 381/173; 381/174; 381/175; 381/396; 381/398; 181/171; 181/172; 367/170; 367/171; 367/181; 367/140; 367/141

(58) Field of Classification Search ................. 29/592.1, 29/594, 609.1; 181/171, 172; 367/140, 141, 367/170, 171, 181; 381/417, 173–175, 348, 381/369, 396, 398
See application file for complete search history.

(56) References Cited

U.S. PATENT DOCUMENTS

| | | | | |
|---|---|---|---|---|
| 5,201,008 A | * | 4/1993 | Arndt et al. | 381/323 |
| 6,493,454 B1 | * | 12/2002 | Loi et al. | 381/328 |
| 7,190,803 B2 | * | 3/2007 | van Halteren | 381/398 |
| 2001/0038703 A1 | | 11/2001 | Paczkowski | |

FOREIGN PATENT DOCUMENTS

KR   1020040073410 A   8/2004

OTHER PUBLICATIONS

International Search Report: mailed May 17, 2007; PCT/KR2006/003795.

* cited by examiner

*Primary Examiner* — Paul D Kim
(74) *Attorney, Agent, or Firm* — Ladas & Parry LLP

(57) ABSTRACT

Provided is a faceplate for an In-The-Ear (ITE) hearing aid and a method of manufacturing a faceplate for an In-The-Ear (ITE) hearing aid in which the faceplate can be manufactured in a compact size, using a foldable flexible printed circuit board (PCB), while maintaining the quality, enabling mass-production, and reducing the manufacturing cost.

1 Claim, 7 Drawing Sheets

US 7,905,006 B2

METHOD OF MANUFACTURING FACEPLATE FOR IN-THE-EAR HEARING AID

TECHNICAL FIELD

The present invention relates to a faceplate for an In-The-Ear (ITE) hearing aid and a method of manufacturing a faceplate for an ITE (In-The-Ear) hearing aid, and more particularly to, a faceplate for an In-The-Ear (ITE) hearing aid and a method of manufacturing a faceplate for an In-The-Ear (ITE) hearing aid in which the faceplate can be manufactured in a compact size, using a foldable flexible printed circuit board (PCB), while maintaining the quality, enabling mass-production, and reducing the manufacturing cost.

BACKGROUND ART

Among the currently available hearing aids or the hearing aids under development, ITE (In-The-Ear) type hearing aids which are respectively inserted into an external auditory canal are manufactured by individual soldering various components such as a volume controller including a microphone, an amplifier and a receiver with elongate electric wires.

However, in the case of analog hearing aids, amplifier terminals are comparatively simple and thus it is not difficult to manufacture hearing aids through individual soldering.

However, in the case of digital hearing aids which are recently available in the market, amplifier terminals becomes large in numbers and complicated. That is, in the case of the digital hearing aids, approximately twenty elongate electric wires are soldered in each digital hearing aid. Accordingly, it is not only difficult to make it compact but also highly experienced soldering experts are needed. As a result, there are the problems that the hearing aids cannot be mass-produced while maintaining a certain level of high quality, and thus the manufacturing cost cannot be reduced.

DISCLOSURE OF THE INVENTION

To solve the above problems, it is an object of the present invention to provide a faceplate for an In-The-Ear (ITE) hearing aid and a method of manufacturing a faceplate for an In-The-Ear (ITE) hearing aid in which the faceplate can be manufactured in a compact size, using a foldable flexible printed circuit board (PCB), while maintaining the quality and enabling mass-production.

It is another object of the present invention to provide a faceplate for an In-The-Ear (ITE) hearing aid and a method of manufacturing a faceplate for an In-The-Ear (ITE) hearing aid in which the manufacturing cost can be reduced.

To accomplish the above object of the present invention, there is provided a method of manufacturing a faceplate for an ITE (In-The-Ear) hearing aid, the ITE hearing aid faceplate manufacturing method comprising:

a hot wind soldering process of soldering an acoustic processor (100) which receives and processes an acoustic signal in a first welding pad (142a) of a first main flexible printed circuit board (PCB) (142);

a first manual soldering process of manually soldering an external memory button (22) and a receiver (138) in first and second welding patterns (142b, 142c) of the first main flexible PCB (142);

a second manual soldering process of manually soldering a front microphone (12), a rear microphone (14) and a volume controller (20) in third to fifth welding patterns (144a, 144b, 144c) of a second main flexible PCB (144);

a first flexible insulating plate covering process of folding and covering a first flexible insulating plate (146) in order to insulate a conductive pattern exposed to the rear side of the first main flexible PCB (142);

a battery positive electrode position fixing process of folding a battery positive electrode (148) for a battery (26) to abut the rear side of the first flexible insulating plate (146);

a second flexible insulating plate covering process of folding and covering a second flexible insulating plate (150) in order to insulate a conductive pattern exposed to the rear side of the second main flexible PCB (144);

a battery negative electrode position fixing process of folding a battery negative electrode (152) for the battery (26) in the rear side of the second flexible insulating plate (150);

a first and second main flexible PCB aligning process of folding both ends of a side flexible PCB (154) at right angles and aligning the first main flexible PCB (142) and the second main flexible PCB (144) in parallel with each other;

a third manual soldering process of manually soldering a socket (18) in a sixth welding pattern (157) of a lower flexible PCB (156) which is positioned in the lower end of the free end portion of the first main flexible PCB (142);

a lower flexible PCB bending process of bending the lower flexible PCB (156) positioned in the lower end of the free end portion of the first main flexible PCB (142) inwards at right angles;

a first to third fixing bracket position fixing process of inserting the first and second main flexible PCBs (142, 144) which face each other and are bent in parallel with each other around the side flexible PCB (154) into the internal space of a molding body (11a) for a faceplate and bending first to third fixing brackets (158, 159, 160) toward the outer side to then be position-fixed; and a first and second bonding pad adhering process of adhering a second bonding pad (164) of the second main flexible PCB (144) on a first bonding pad (162) of the first main flexible PCB (142) to then be formed into a box shape.

According to another aspect of the present invention, there is also provided a faceplate for an ITE (In-The-Ear) hearing aid, the ITE hearing aid faceplate comprising:

a first main flexible PCB (Printed Circuit Board) (142) in which components of the hearing aid including a receiver (138) are soldered;

a second main flexible PCB (144) in which components of the hearing aid including microphones (12, 14) are soldered;

a first flexible insulating plate (146) which insulates a conductive pattern exposed to the rear side of the first main flexible PCB (142);

a battery positive electrode (148) for a battery (26) to abut the rear side of the first flexible insulating plate (146);

a second flexible insulating plate (150) which insulates a conductive pattern exposed to the rear side of the second main flexible PCB (144);

a battery negative electrode (152) for the battery (26) in the rear side of the second flexible insulating plate (150);

a socket (18) which is manually soldered in a lower flexible PCB (156) which is positioned in the lower end of the free end portion of the first main flexible PCB (142);

first to third fixing brackets (158, 159, 160) which insert the first and second main flexible PCBs (142, 144) which face each other and are bent in parallel with each other around the side flexible PCB (154) into the internal space of a molding body (11a) for a faceplate, to then be position-fixed; and first and second bonding pads in which the second bonding pad (164) of the second main flexible PCB (144) is adhered on the first bonding pad (162) of the first main flexible PCB (142) to then be formed into a box shape.

BRIEF DESCRIPTION OF THE DRAWINGS

The above and other objects and/or advantages of the present invention will become more apparent by describing the preferred embodiment thereof in detail with reference to the accompanying drawings in which.

BEST MODE FOR CARRYING OUT THE INVENTION

Hereinbelow, a method of manufacturing a faceplate for an ITE (In-The-Ear) hearing aid and a faceplate using the same according to the present invention will be described with reference to the accompanying drawings.

Figure 1:
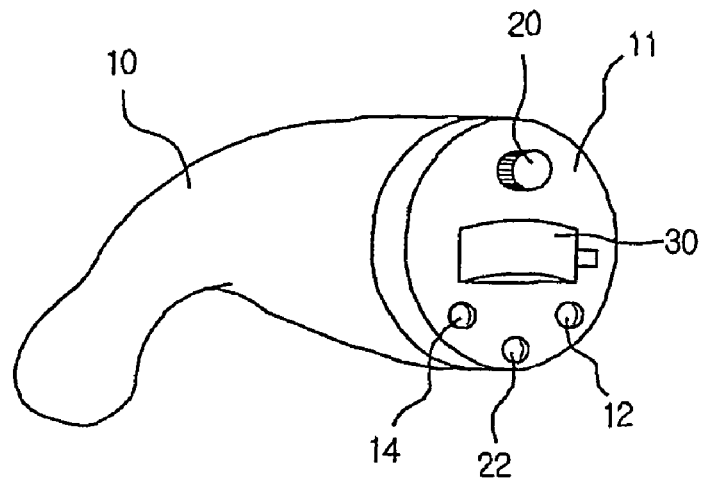
FIG. 1 is a perspective view of an ITE (In-The-Ear) hearing aid according to an embodiment of the present invention.
Figure 2:
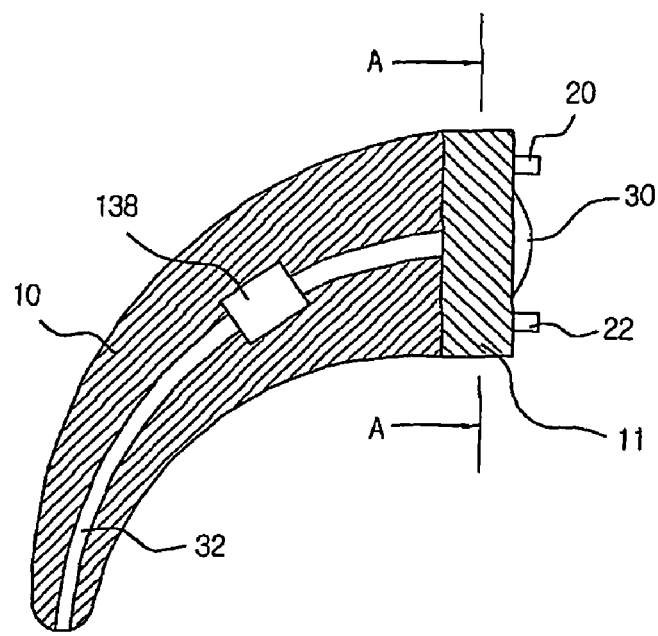
FIG. 2 is a cross-sectional view of the ITE hearing aid according to the embodiment of the present invention.
Figure 3:
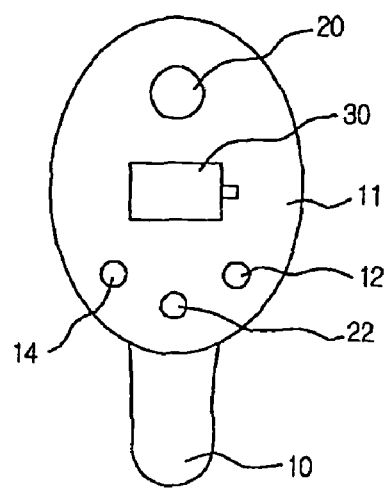
FIG. 3 is a front view of the ITE hearing aid according to the embodiment of the present invention.
Figure 4:
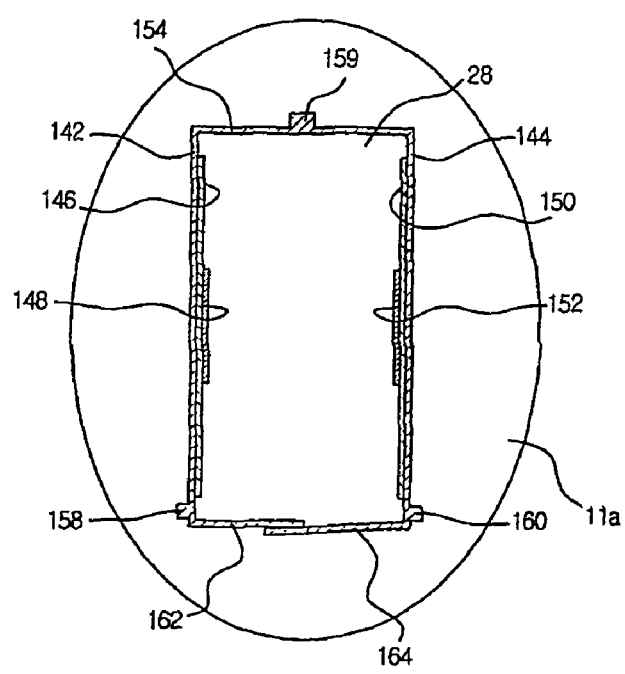
FIG. 4 is a cross-sectional view of a faceplate of the ITE hearing aid cut along a line A-A of FIG. 2, according to the embodiment of the present invention.
Figure 7:
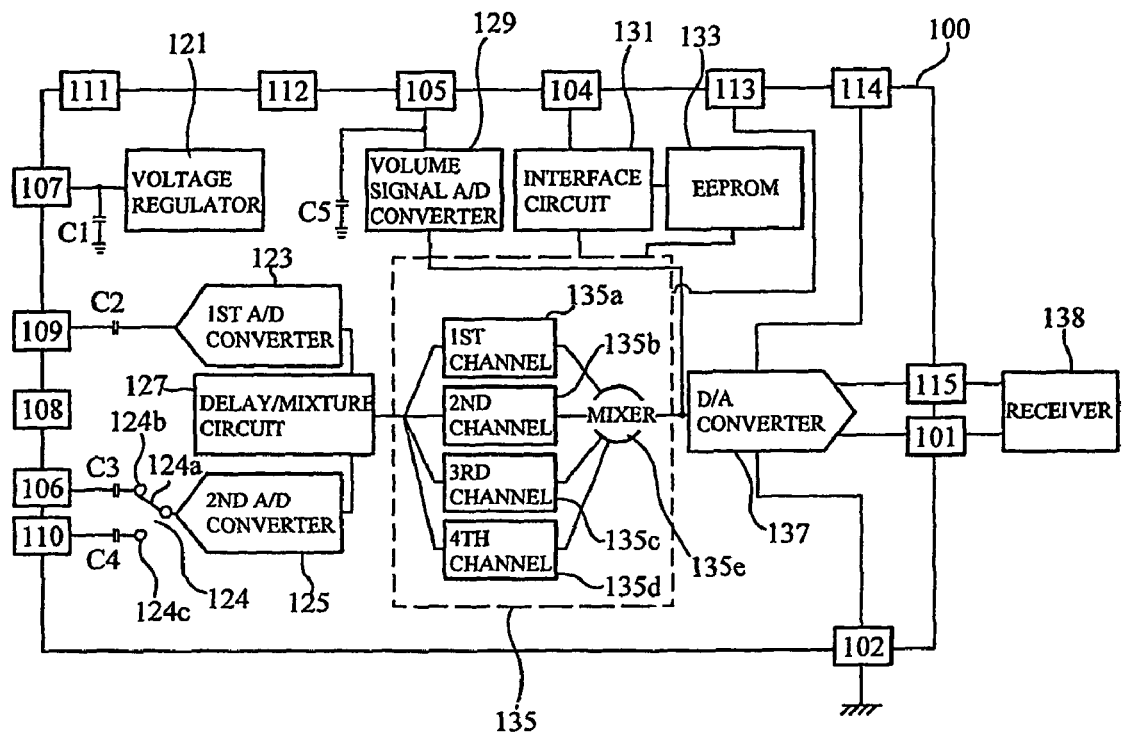
FIG. 7 is a circuit block diagram of an acoustic processor which is applied to the embodiment of the present invention.
Figure 8:
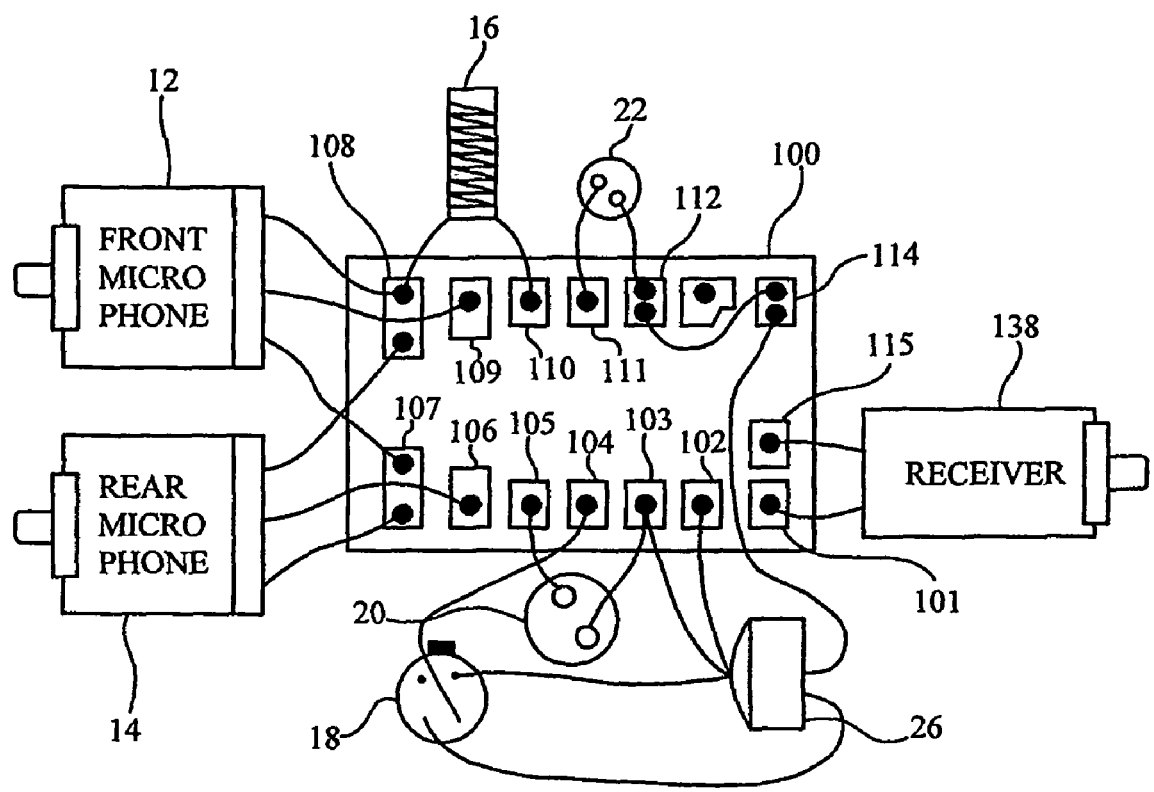
FIG. 8 is a connection diagram schematically showing the state that front and rear microphones, a telecoil, a memory button, a volume controller, a socket, a receiver are soldered at the terminals of the circuit blocks in the acoustic processor.
Figure 9:
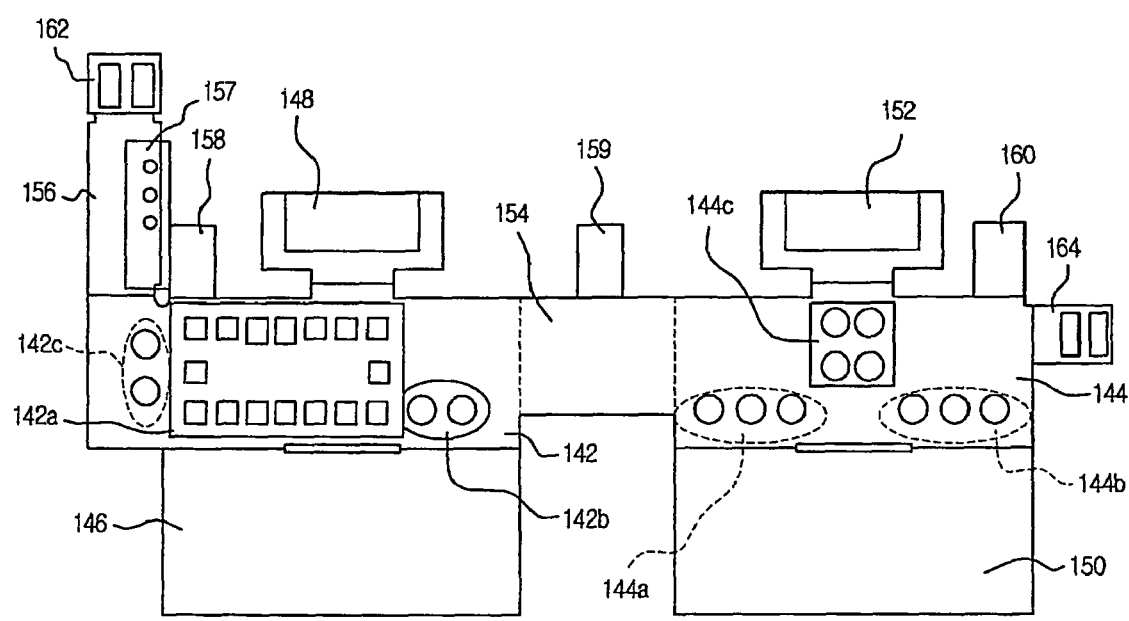
FIG. 9 is a plan view of the flexible PCB applied to the embodiment of the present invention.

FIG. 1 is a perspective view of an ITE (In-The-Ear) hearing aid according to an embodiment of the present invention. FIG. 2 is a cross-sectional view of the ITE hearing aid according to the embodiment of the present invention. FIG. 3 is a front view of the ITE hearing aid according to the embodiment of the present invention. FIG. 4 is a cross-sectional view of a faceplate of the ITE hearing aid cut along a line A-A of FIG. 2, according to the embodiment of the present invention. FIG. 7 is a circuit block diagram of an acoustic processor which is applied to the embodiment of the present invention. FIG. 8 is a connection diagram schematically showing the state that front and rear microphones, a telecoil, a memory button, a volume controller, a socket, a receiver are soldered at the terminals of the circuit blocks in the acoustic processor. FIG. 9 is a plan view of the flexible PCB applied to the embodiment of the present invention.

As shown in FIGS. 1-4 and 7-9, an ITE (In-The-Ear) hearing aid according to an embodiment of the present invention includes: a shell 10 formed in a snail shape; a faceplate 11 which is installed at the input side of the shell 10; front and rear microphones 12 and 14 which are installed on the faceplate 11 to receive an acoustic signal; a telecoil 16 filtering high-band noise at the time of a telephone call; a socket 18 which receives parameters including for example, a news listening parameter (hereinafter referred to as an M1 mode parameter), a music listening parameter (hereinafter referred to as an M2 mode parameter), a normal dialogue listening parameter at the place where noise is small (hereinafter referred to as an M3 mode parameter), and an abnormal dialogue listening parameter at the place where noise is loud (hereinafter referred to as an M4 mode parameter) from an external control personal computer (not shown), to then control an auditory sense difference; a volume controller 20 controlling the reception volume of the acoustic signal received by the telecoil 16 and the front and rear microphones 12 and 14; an external memory button 22 selecting one of the M1 to M4 mode parameters which are input from the personal computer; an acoustic processor 100 which is installed in the faceplate 11 and processes the acoustic signal which is received by the telecoil 16 and the front and rear microphones 12 and 14; a receiver 138 which receives and outputs the acoustic signal processed in the acoustic processor 100; a battery 26 supplying an operating voltage to the acoustic processor 100; an accommodation space 28 accommodating the battery 26; a cover 30 opening and closing the opening of the accommodation space 28; and a tube 32 which connects the faceplate 11 and the shell 10, and simultaneously in which the receiver 138 is disposed in the middle of the tube 32 in order to output the acoustic signal to an eardrum.

As shown in FIG. 7, the acoustic processor 100 includes a voltage regulator 121 which receives a direct-current (DC) voltage supplied from the battery 26 via an input terminal 112 and regulates the input DC voltage into a constant DC voltage to then output the same; a first capacitor C1 which filters the noise of a high level included in the constant DC voltage regulated in the voltage regulator 121, and supplies the filtered result to the front and rear microphones 12 and 14 through an output terminal 107, respectively; second and third capacitors C2 and C3 which receive the acoustic signal received by the front and rear microphones 12 and 14 via input terminals 109 and 106, and filter the noise of a high level included in the acoustic signal, respectively; a fourth capacitor C4 which receives the acoustic signal received by the telecoil 16 via an input terminal 110 and filters the noise of a high level included in the acoustic signal, in the case that a moving terminal 124a of a changeover switch 124 is connected to the fourth capacitor C4, that is, at the time of a telephone call which is connected to a fixed terminal 124c; first and second analog-to-digital (A/D) converters 123 and 125 which receive an analog acoustic signal from which the noise of a high level included in the acoustic signal received by the telecoil 16 has been filtered, and converts the analog acoustic signal into a digital acoustic signal, respectively, in the case that the moving terminal 124a of the changeover switch 124 is connected to the third capacitor C3, that is, at the time of a telephone call which is connected to a fixed terminal 124a, or the noise of a high level included in the acoustic signal received by the front and rear microphones 12 and 14 is filtered in the fourth capacitor C4, or in the case that the moving terminal 124a of the changeover switch 124 is connected to the fourth capacitor C4, that is, at the time of a telephone call which is connected to a fixed terminal 124c; a delay/mixture circuit 127 which receives the digital signals from the A/D converters 123 and 125 and delays and mixes the received digital signals; a fifth capacitor C5 which receives an acoustic signal whose volume is controlled by a volume controller 20 via an input terminal 105 and filters the noise included in the acoustic signal; a volume signal A/D converter 129 which receives an analog acoustic signal from which the noise included in the acoustic signal whose volume is controlled by the fifth capacitor C5 has been filtered and converts the analog acoustic signal into a digital signal; an EEPROM (Electrically Erasable Programmable Read Only Memory) 133 which receives a news listening parameter, a music listening parameter, a normal situation dialogue listening parameter, and a loud situation dialogue listening parameter via the socket 18 and the input terminal 104 from an external control personal computer (not shown) and storing a mode signal interfaced in an interface circuit 131; an equalizer 135 which receives the digital volume signal which has been converted into the digital signal in the volume signal A/D converter 129 which has received the digital acoustic signal which has been delayed and mixed in the delay/mixture circuit 127, and one parameter of the news listening parameter, the music listening parameter, the normal situation dialogue listening parameter, and the loud situation dialogue listening parameter at the place where the noise is loud from the EEPROM 133, and divides the frequency band of the acoustic signal of the received result into first to fourth channel bands, to then amplify and mix the divided acoustic signal; a digital-to-analog (D/A) converter 137 which receives the mixed digital acoustic signal which is output from a mixer 135e of the equalizer 135 and converts the received digital acoustic signal into an analog signal; and a receiver 138 which receives the analog acoustic signal output from the D/A converter 137 via output terminals 115 and 101 to then output the analog acoustic signal to an auditory organ.

The equalizer 135 includes first through fourth channel amplifiers 135a, 135b, 135c, and 135d which divide the frequency band of the acoustic signal into first through fourth channels and amplify the divided acoustic signal, respectively, and a mixer 135e which mixes the acoustic signals which are obtained after the first through fourth amplifiers 135a, 135b, 135c, and 135d have divided and amplified according to the respective frequency bands.

In the drawings, a reference numeral 102 denotes a grounded terminal, and a reference numeral 114 denotes a voltage battery power terminal.

Next, a method of manufacturing a faceplate 11 for an ITE hearing aid according to an embodiment of the present invention will be described with reference to FIGS. 5 and 6.

Figure 5:
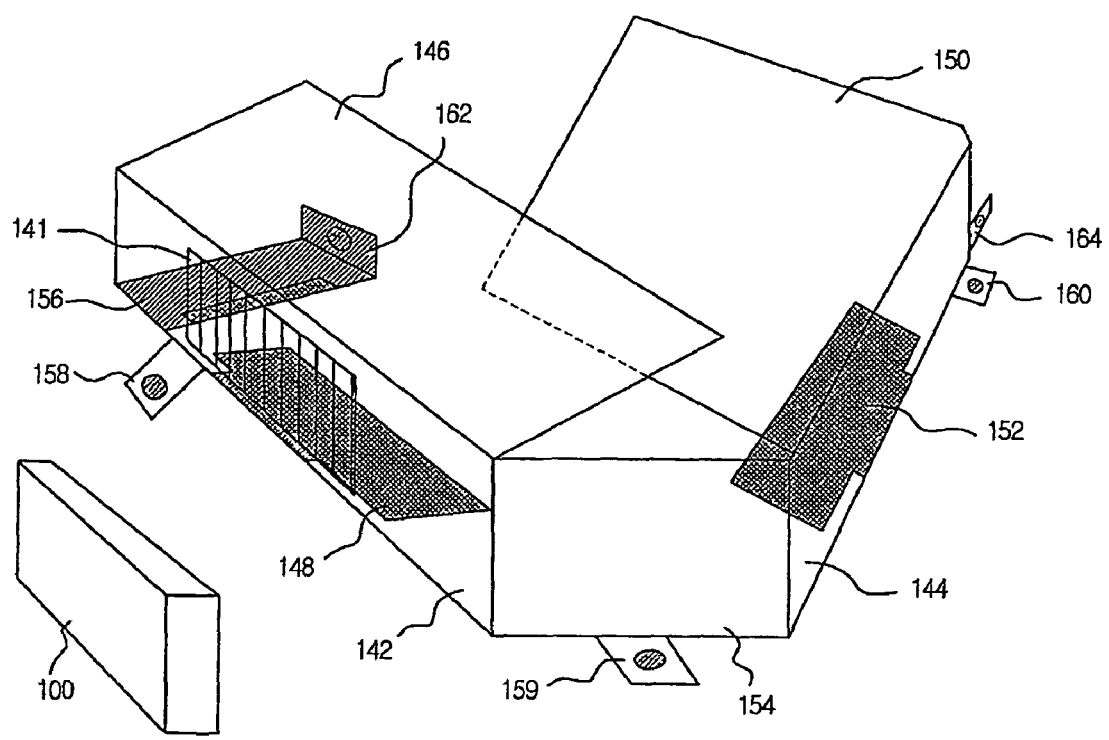
FIG. 5 is a partially unfolded perspective view of a flexible printed circuit board (PCB) for the ITE hearing aid according to the embodiment of the present invention.
Figure 6:
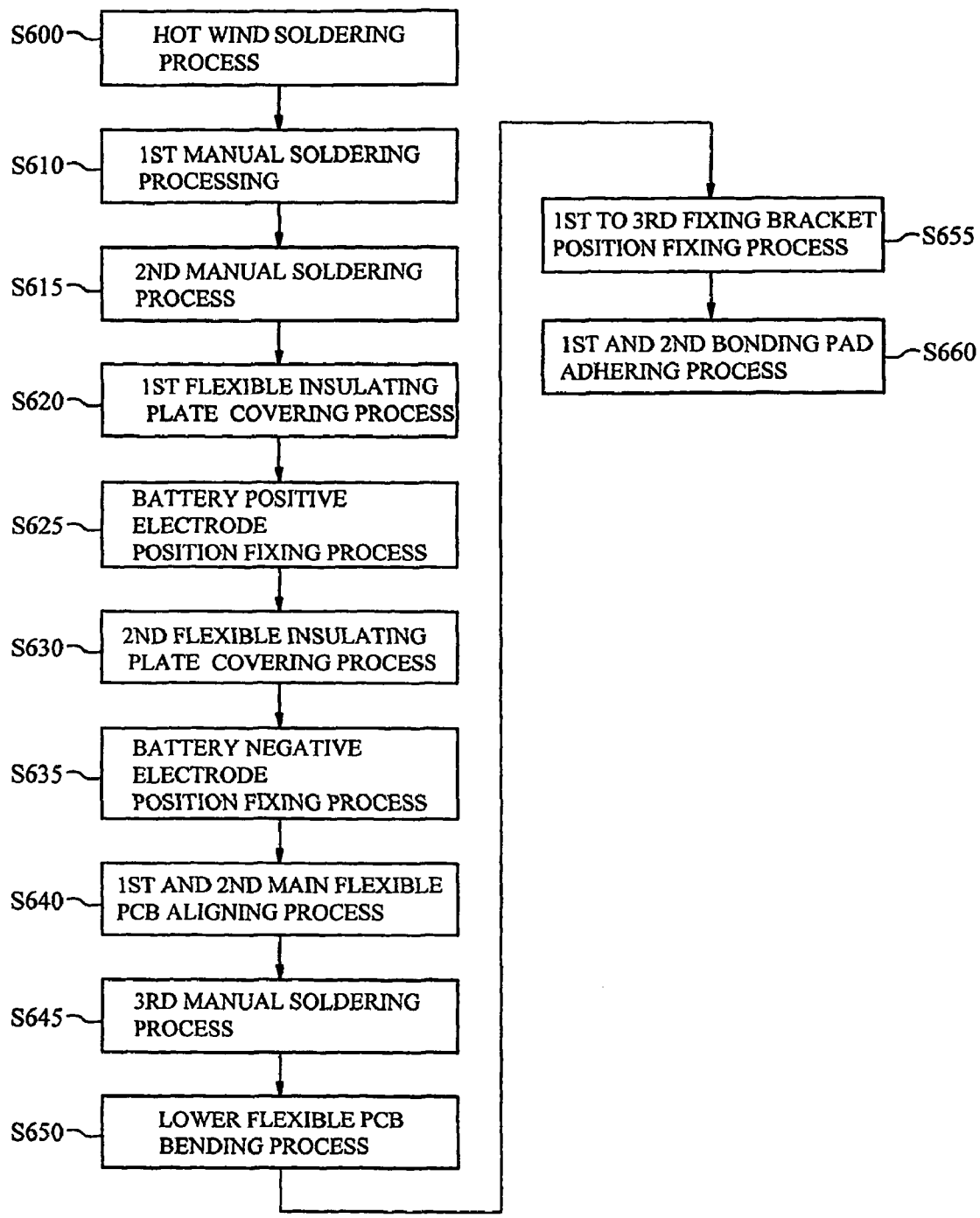
FIG. 6 is a flowchart view which illustrates a method of assembling the flexible PCB of FIG. 5.

FIG. 5 is a partially unfolded perspective view of a flexible printed circuit board (PCB) for the ITE hearing aid according to the embodiment of the present invention, and FIG. 6 is a flowchart view which illustrates a method of assembling the flexible PCB of FIG. 5.

Referring to FIGS. 5 and 6, a method of manufacturing a faceplate for an ITE (In-The-Ear) hearing aid, includes a hot wind soldering process S600, a first manual soldering process S610, a second manual soldering process S615, a first flexible insulating plate covering process S620, a battery positive electrode position fixing process S625, a second flexible insulating plate covering process S630, a battery negative electrode position fixing process S635, a first and second main flexible PCB aligning process S640, a third manual soldering process S645, a lower flexible PCB bending process S650, a first to third fixing bracket position fixing process S655, and a first and second bonding pad adhering process S660.

The hot wind soldering process S600 solders an acoustic processor 100 which receives and processes an acoustic signal in a first welding pad 142a of a first main flexible printed circuit board (PCB) 142.

The first manual soldering process S610 manually solders an external memory button 22 and a receiver 138 in first and second welding patterns 142b and 142c of the first main flexible PCB 142 where the acoustic processor 100 has been soldered in the hot wind soldering process S600.

The second manual soldering process S615 manually solders a front microphone 12, a rear microphone 14 and a volume controller 20 in third to fifth welding patterns 144a, 144b, and 144c of a second main flexible PCB 144 after the first manual soldering process S610.

The first flexible insulating plate covering process S620 folds and covers a first flexible insulating plate 146 in order to insulate a conductive pattern exposed to the rear side of the first main flexible PCB 142.

The battery positive electrode position fixing process S625 folds a battery positive electrode 148 for a battery 26 to abut the rear side of the first flexible insulating plate 146 after the first flexible insulating plate covering process S620.

The second flexible insulating plate covering process S630 folds and covers a second flexible insulating plate 150 in order to insulate a conductive pattern exposed to the rear side of the second main flexible PCB 144 after the battery positive electrode position fixing process S625.

The battery negative electrode position fixing process S635 folds a battery negative electrode 152 for the battery 26 in the rear side of the second flexible insulating plate 150 after the second flexible insulating plate covering process S630.

The first and second main flexible PCB aligning process S640 folds both ends of a side flexible PCB 154 at right angles and aligning the first main flexible PCB 142 and the second main flexible PCB 144 in parallel with each other, after the battery negative electrode position fixing process S635.

The third manual soldering process S645 manually solders a socket 18 in a sixth welding pattern 157 of a lower flexible PCB 156 which is positioned in the lower end of the free end portion of the first main flexible PCB 142 after the first and second main flexible PCB aligning process S640.

The lower flexible PCB bending process S650 bends the lower flexible PCB 156 positioned in the lower end of the free end portion of the first main flexible PCB 142 inwards at right angles.

The first to third fixing bracket position fixing process S655 inserts the first and second main flexible PCBs 142 and 144 which face each other and are bent in parallel with each other around the side flexible PCB 154 into the internal space of a molding body 11a for a faceplate and bending first to third fixing brackets 158, 159, and 160 toward the outer side to then be position-fixed.

The first and second bonding pad adhering process S660 adheres a second bonding pad 164 of the second main flexible PCB 144 on a first bonding pad 162 of the first main flexible PCB 142 to then be formed into a box shape, after the first to third fixing bracket position fixing process S655.

Next, a function and an effect of the ITE hearing aid according to the embodiment of the present invention will be described below.

Firstly, after an ITE hearing aid according to the present invention has been manufactured, the socket 18 installed at the accommodation space 28 in accommodating the battery 26 is connected with a personal computer (not shown) via a cable or a universal serial bus (USB) cable. Then, parameters stored in the external control personal computer (not shown) including for example, a news listening parameter (M1 mode parameter), a music listening parameter (M2 mode parameter), a normal dialogue listening parameter at the place where noise is small (M3 mode parameter), and an abnormal dialogue listening parameter at the place where noise is loud (M4 mode parameter) from an external control personal computer (not shown), are input to the ITE hearing aid to then control an auditory sense difference. The parameters are stored in the EEPROM 131 through the socket 18 and the interface circuit. If the external memory button 22 is depressed, an acoustic signal is selected according to various kinds of environmental circumstances to then be listened.

In other words, if the external memory button 22 is pressed once, the news listening parameter (M1 mode parameter) which enables a user to listen to the news stored in the EEPROM 131 is input to the equalizer 135, to accordingly enable the user to listen to the news at a high-sensitivity.

If the external memory button 22 is pressed twice, the music listening parameter (M2 mode parameter) which enables a user to listen to the music stored in the EEPROM 131 is input to the equalizer 135, to accordingly enable the user to listen to the music at a high-sensitivity.

If the external memory button 22 is pressed three times, the normal situation dialogue listening parameter (M3 mode parameter) stored in the EEPROM 131 at the place where the noise is small is input to the equalizer 135, to accordingly enable the user to listen to the dialogue at a high-sensitivity.

If the external memory button 22 is pressed four times, the abnormal situation dialogue listening parameter (M4 mode parameter) which enables the user to listen to the dialogue stored in the EEPROM 131 at the place where the noise is loud is input to the equalizer 135, to accordingly enable the user to listen to the dialogue at the place which the noise is loud at a high-sensitivity.

As described above, the ITE hearing aid according to the present invention is initialized. Then, if the ITE hearing aid is inserted into the external auditory canal of an ear, and if the external memory button 22 is pressed once in order to listen to the news at the state that the moving contact 124a of the changeover switch 124 is set to the fixed contact 124b, the news listening parameter (M1 mode parameter) which enables the user to listen to the news stored in the EEPROM 131 is input to the equalizer 135. Accordingly, the front and rear microphones 12 and 14 receive news acoustic signals which are output from a television receiver or radio and are input to input terminals 109 and 116 of the acoustic processor 100. The acoustic processor 100 filters the noise of a high level included in the news acoustic signals which are received in the front and rear microphones 12 and 14, respectively, and converts the analog news acoustic signals into the digital news acoustic signals in the first and second A/D converters 123 and 125 to then be output to the delay/mixture circuit 127.

The delay/mixture circuit 127 receives the news acoustic signals which have been transformed into the digital news acoustic signals in the first and second A/D converters 123 and 125 and delays and simultaneously mixes the digital acoustic signals to then output the result to the equalizer 135. The equalizer 135 receives the news acoustic signal which is obtained by matching a phase difference between the news acoustic signal received in the front microphone 12 delayed by the delay/mixture circuit 127 and the news acoustic signal received in the rear microphone 14 and mixing the news acoustic signals which have been received by the front and rear microphones 12 and 14, and divides the frequency band of the received news acoustic signals into the first to fourth channel bands 135a, 135b, 135c, and 135d and amplifies the divided channel bands, respectively. The news acoustic signals which are obtained by dividing the acoustic signals into the first to fourth channel bands 135a, 135b, 135c, and 135d and amplifying the divided channel bands are mixed in the mixer 135e of the equalizer 135 to then be output to the D/A converter 137.

The D/A converter 137 receives the digital news acoustic signal which is obtained by dividing the news acoustic signals into the first to fourth channel bands 135a, 135b, 135c, and 135d and amplifying the divided channel bands to thus mix the amplified news acoustic signals in the equalizer 135, and converts the received digital acoustic signal into the analog signal and outputs the analog signal through output terminals 115 and 101 to the receiver 138. The receiver 138 outputs the analog news acoustic signal so as to be audible to the auditory sensing organ.

Here, if the news acoustic signal which is to listen is so high or so low, the volume controller 20 is controlled to set the sound level to a good level to listen. Then, the sound level which has been set to a good level to listen is input through the input terminal 105 to the volume signal A/D converter 129. Then, the volume signal A/D converter 129 receives the analog news acoustic signal and converts the received analog news acoustic signal into the digital signal to then output the digital signal to the output terminal of the mixer 135e of the equalizer 135 and set the volume of the news acoustic signal.

Meanwhile, if the ITE hearing aid is inserted into the external auditory canal of an ear, at the state where the ITE hearing aid according to the present invention is initialized, and if the moving contact 124a of the changeover switch 124 is set to the fixed contact point 124c, it becomes possible to make a telephone call.

As described above, if the ITE hearing aid is inserted into the external auditory canal of an ear, at the state where the ITE hearing aid according to the present invention is initialized, and if the external memory button 22 is pressed twice at the state that the moving contact 124a of the changeover switch 124 is set to the fixed contact 124c, the music listening parameter (M2 mode parameter) which enables the user to listen to the music stored in the EEPROM 131 is input to the equalizer 135, to accordingly enable the user to listen to the music at a high-sensitivity. If the external memory button 22 is pressed three times, the normal situation dialogue listening parameter (M3 mode parameter) stored in the EEPROM 131 at the place where the noise is small is input to the equalizer 135, to accordingly enable the user to listen to the dialogue at a high-sensitivity. If the external memory button 22 is pressed four times, the abnormal situation dialogue listening parameter (M4 mode parameter) which enables the user to listen to the dialogue stored in the EEPROM 131 at the place where the noise is loud is input to the equalizer 135, to accordingly enable the user to listen to the dialogue at the place which the noise is loud at a high-sensitivity.

Since the remaining operations of the ITE hearing aid according to the present invention are similar to the operation for listening to the news as described above, at this state, the detailed description thereof will be omitted.

INDUSTRIAL APPLICABILITY

As described above, the present invention provides a faceplate for an In-The-Ear (ITE) hearing aid and a method of manufacturing a faceplate for an In-The-Ear (ITE) hearing aid in which the faceplate can be manufactured in a compact size, using a foldable flexible printed circuit board (PCB), while maintaining the quality, enabling mass-production, and reducing the manufacturing cost.

As described above, the present invention has been described with respect to a particularly preferred embodiment. However, the present invention is not limited to the above embodiment, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

What is claimed is:

1. A method of manufacturing a faceplate for an ITE (In-The-Ear) hearing aid, the ITE hearing aid faceplate manufacturing method comprising:

a hot wind soldering process of soldering an acoustic processor (100) which receives and processes an acoustic signal in a first welding pad (142*a*) of a first main flexible printed circuit board (PCB) (142);

a first manual soldering process of manually soldering an external memory button (22) and a receiver (138) in first and second welding patterns (142*b*, 142*c*) of the first main flexible PCB (142) where the acoustic processor (100) has been soldered in the hot wind soldering process;

a second manual soldering process of manually soldering a front microphone (12), a rear microphone (14) and a volume controller (20) in third to fifth welding patterns (144*a*, 144*b*, 144*c*) of a second main flexible PCB (144) after the first manual soldering process;

a first flexible insulating plate covering process of folding and covering a first flexible insulating plate (146) in order to insulate a conductive pattern exposed to the rear side of the first main flexible PCB (142);

a battery positive electrode position fixing process of folding a battery positive electrode (148) for a battery (26) to abut the rear side of the first flexible insulating plate (146) after the first flexible insulating plate covering process;

a second flexible insulating plate covering process of folding and covering a second flexible insulating plate (150) in order to insulate a conductive pattern exposed to the rear side of the second main flexible PCB (144) after the battery positive electrode position fixing process;

a battery negative electrode position fixing process of folding a battery negative electrode (152) for the battery (26) in the rear side of the second flexible insulating plate (150) after the second flexible insulating plate covering process;

a first and second main flexible PCB aligning process of folding both ends of a side flexible PCB (154) at right angles and aligning the first main flexible PCB (142) and the second main flexible PCB (144) in parallel with each other, after the battery negative electrode position fixing process;

a third manual soldering process of manually soldering a socket (18) in a sixth welding pattern (157) of a lower flexible PCB (156) which is positioned in the lower end of the free end portion of the first main flexible PCB (142) after the first and second main flexible PCB aligning process;

a lower flexible PCB bending process of bending the lower flexible PCB (156) positioned in the lower end of the free end portion of the first main flexible PCB (142) inwards at right angles;

a first to third fixing bracket position fixing process of inserting the first and second main flexible PCBs (142, 144) which face each other and are bent in parallel with each other around the side flexible PCB (154) into the internal space of a molding body (11*a*) for a faceplate and bending first to third fixing brackets (158, 159, 160) toward the outer side to then be position-fixed; and a first and second bonding pad adhering process of adhering a second bonding pad (164) of the second main flexible PCB (144) on a first bonding pad (162) of the first main flexible PCB (142) to then be formed into a box shape, after the first to third fixing bracket position fixing process.

\* \* \* \* \*